United States Patent
Kennedy et al.

(10) Patent No.: US 6,227,140 B1
(45) Date of Patent: May 8, 2001

(54) SEMICONDUCTOR PROCESSING EQUIPMENT HAVING RADIANT HEATED CERAMIC LINER

(75) Inventors: William S. Kennedy, Redwood Shores; Robert A. Maraschin, Cupertino, both of CA (US); Thomas E. Wicker, Reno, NV (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/401,308

(22) Filed: Sep. 23, 1999

(51) Int. Cl.[7] .................................................. C23C 16/00
(52) U.S. Cl. ...................... 118/723 R; 156/345
(58) Field of Search ........................... 118/723 R, 723 E, 118/723 ER, 723 I, 723 IR, 723 AN, 723 MW, 723 MR, 723 MA, 723 ME, 724, 504; 156/345; 204/298.09, 298.11

(56) References Cited

U.S. PATENT DOCUMENTS

| | | |
|---|---|---|
| 4,340,462 | 7/1982 | Koch ..................... 204/298 |
| 4,491,496 | 1/1985 | Laporte et al. ....................... 156/345 |
| 4,948,458 | 8/1990 | Ogle ...................................... 156/643 |
| 5,006,220 | 4/1991 | Hijikata et al. ................. 204/298.33 |
| 5,022,979 | 6/1991 | Hijikata et al. ................. 204/298.33 |
| 5,085,727 | 2/1992 | Steger ................................... 156/345 |
| 5,182,059 | 1/1993 | Kawasaki et al. ....................... 264/65 |
| 5,200,232 | 4/1993 | Tappan et al. ......................... 427/569 |
| 5,262,029 | 11/1993 | Erskine et al. ................... 204/298.15 |
| 5,292,399 | 3/1994 | Lee et al. ............................ 156/643 |
| 5,366,585 | 11/1994 | Robertson et al. .................. 156/643 |
| 5,530,222 | 6/1996 | Peck et al. . |
| 5,556,501 | 9/1996 | Collins et al. ........................ 156/345 |
| 5,569,356 | 10/1996 | Lenz et al. ......................... 156/643.1 |
| 5,637,237 | 6/1997 | Oehrlein et al. . |
| 5,641,375 | 6/1997 | Nitescu et al. ....................... 156/345 |
| 5,680,013 | 10/1997 | Dornfest et al. ................. 315/111.21 |
| 5,788,799 | 8/1998 | Steger et al. ......................... 156/345 |
| 5,798,016 | 8/1998 | Oehrlein et al. ..................... 156/345 |
| 5,820,723 | 10/1998 | Benjamin et al. .................... 156/345 |
| 5,827,408 | * 10/1998 | Raaijmakers .................... 204/192.12 |
| 5,838,529 | 11/1998 | Shufflebotham et al. ........... 361/234 |
| 5,863,376 | 1/1999 | Wicker et al. ....................... 156/345 |
| 5,885,356 | 3/1999 | Zhao et al. ..................... 118/723 ER |
| 5,888,907 | 3/1999 | Tomoyasu et al. .................. 438/714 |
| 5,895,586 | 4/1999 | Kaji et al. ........................ 219/121.43 |
| 5,904,778 | 5/1999 | Lu et al. ........................... 118/723 R |
| 5,944,902 | * 8/1999 | Redeker et al. ............... 118/723 AN |
| 6,036,877 | * 3/2000 | Collins et al. ........................... 216/68 |
| 6,055,927 | * 5/2000 | Shang et al. .................. 118/723 MP |

* cited by examiner

Primary Examiner—Gregory Mills
Assistant Examiner—Luz L. Alejandro
(74) Attorney, Agent, or Firm—Burns, Doane, Swecker & Mathis, LLP

(57) ABSTRACT

A plasma processing chamber including a ceramic liner heated by radiant heating. The liner can be a series of tiles or a continuous cylindrical liner. The liner and other parts such as a gas distribution plate and a plasma screen can be made of SiC which advantageously confines the plasma and provides temperature control of the inner surfaces of the chamber. To remove excess heat from the liner, the ceramic liner can be supported on a resilient aluminum support frame which conducts heat from the liner to a temperature controlled member such as a top plate of the chamber. The support frame can include a continuous upper portion and a segmented lower portion which allows thermal stresses to be accommodated during processing of semiconductor substrates in the plasma chamber.

20 Claims, 4 Drawing Sheets

SEMICONDUCTOR PROCESSING EQUIPMENT HAVING RADIANT HEATED CERAMIC LINER

FIELD OF THE INVENTION

The invention relates to semiconductor processing equipment and more particularly to a heated ceramic liner for a processing chamber such as a plasma etching chamber.

BACKGROUND OF THE INVENTION

In the field of semiconductor processing, vacuum processing chambers are generally used for etching and chemical vapor deposition (CVD) of materials on substrates by supplying an etching or deposition gas to the vacuum chamber and application of an RF field to the gas to energize the gas into a plasma state. Examples of parallel plate, transformer coupled plasma (TCP™) which is also called inductively coupled plasma (ICP), and electron-cyclotron resonance (ECR) reactors and components thereof are disclosed in commonly owned U.S. Pat. Nos. 4,340,462; 4,948,458; 5,200,232 and 5,820,723. Because of the corrosive nature of the plasma environment in such reactors and the requirement for minimizing particle and/or heavy metal contamination, it is highly desirable for the components of such equipment to exhibit high corrosion resistance.

In order to protect the chamber walls, U.S. Pat. Nos. 5,366,585; 5,556,501; 5,637,237; 5,788,799; 5,798,016; and 5,885,356 propose liner arrangements. For instance, the '585 patent discloses a free standing ceramic liner having a thickness of at least 0.005 inches and machined from solid alumina. The '585 patent also mentions use of ceramic layers which are deposited without consuming the underlying aluminum can be provided by flame sprayed or plasma sprayed aluminum oxide. The '501 patent discloses a process-compatible liner of polymer or quartz or ceramic. The '237 patent discloses a heater arrangement for heating a metallic liner to a temperature of 100 to 600° C. to impede formation of films on the liner wall. The '799 patent discloses a temperature controlled ceramic liner having a resistance heater embedded therein and the ceramic can be alumina, silica, titania, zirconia, silicon carbide, titanium carbide, zirconium carbide, aluminum nitride, boron nitride, silicon nitride and titanium nitride. The '016 patent discloses a liner of ceramics, aluminum, steel and/or quartz with aluminum being preferred for its ease of machinability and having a coating of aluminum oxide, $Sc_2O_3$ or $Y_2O_3$, with $Al_2O_3$ being preferred for coating aluminum to provide protection of the aluminum from plasma. The '356 patent discloses a ceramic liner of alumina and a ceramic shield of aluminum nitride for the wafer pedestal for use in CVD chambers. U.S. Pat. No. 5,904,778 discloses a SiC CVD coating on free standing SiC for use as a chamber wall, chamber roof, or collar around the wafer. U.S. Pat. No. 5,292,399 discloses a SiC ring surrounding a wafer pedestal. A technique for preparing sintered SiC is disclosed in U.S. Pat. No. 5,182,059.

Prior art attempts at temperature control of liners in plasma processing reactors include arrangements wherein heaters are embedded in the liners or heaters are arranged to thermally conduct heat into the liners. Such arrangements, however, may not provide uniform heating of the liners which can lead to non-uniform processing of individual substrates or process drift during sequential processing of a batch of substrates. As such, there is a need for liner heating arrangements which provide better temperature control of the liner.

SUMMARY OF THE INVENTION

The invention provides a radiant heater for a plasma processing system wherein semiconductor substrates are processed in a plasma chamber having a substrate support, a gas supply, an energy source and a ceramic liner heated by radiant heating. The plasma processing chamber has an interior space bounded by a chamber sidewall and the substrate support is located within the interior space such that the chamber sidewall is spaced outwardly of a periphery of the substrate support. The energy source energizes process gas supplied to the interior space by the gas supply into a plasma state during processing of a substrate supported on the substrate support.

In one embodiment, the radiant heater comprises a resistance heater embedded in a metal body having a heat radiating surface facing the outer periphery of the liner. In another embodiment, the heater comprises a resistance heating coil spaced from the outer periphery of the liner. A heat radiating shield which reflects heat towards the liner can be located between the chamber wall and the heater. The heater can be supported by one or more heater supports such as hangers, straps, or other expedient.

DETAILED DESCRIPTION OF THE PREFERRED EMBODIMENTS

According to the invention, a radiant heated ceramic liner is provided which can achieve one or more of the following objectives: maintaining good plasma formation by providing an electrical path to ground through the liner, avoiding process drift by providing thermal control of the liner, and preventing Al contamination by shielding Al chamber walls and components from the substrate being processed. With regard to the electrical grounding of the liner, the ceramic liner is preferably made from an electrically conductive material. A preferred ceramic material is Si or a carbide such as SiC, materials which can be obtained in high purity and which have been found to exhibit high resistance to the corrosive conditions found in plasma reactors such as plasma etching chambers.

The invention provides a plasma chamber wherein various components including a ceramic liner are made of Si or SiC. Such materials are compatible in plasma environments since plasma erosion of Si or SiC produces gaseous Si or C compounds which can be pumped from the chamber without particle contamination of the substrate. With regard to thermal control, SiC has been found to exhibit exceptionally high thermal conductivity enabling the liner to be heated or cooled to a desired temperature range during processing of substrates such as silicon wafers. With regard to preventing Al contamination, the ceramic liner confines the plasma inwardly of the liner and thus avoids attack of Al walls or components by the plasma.

Figure 1:
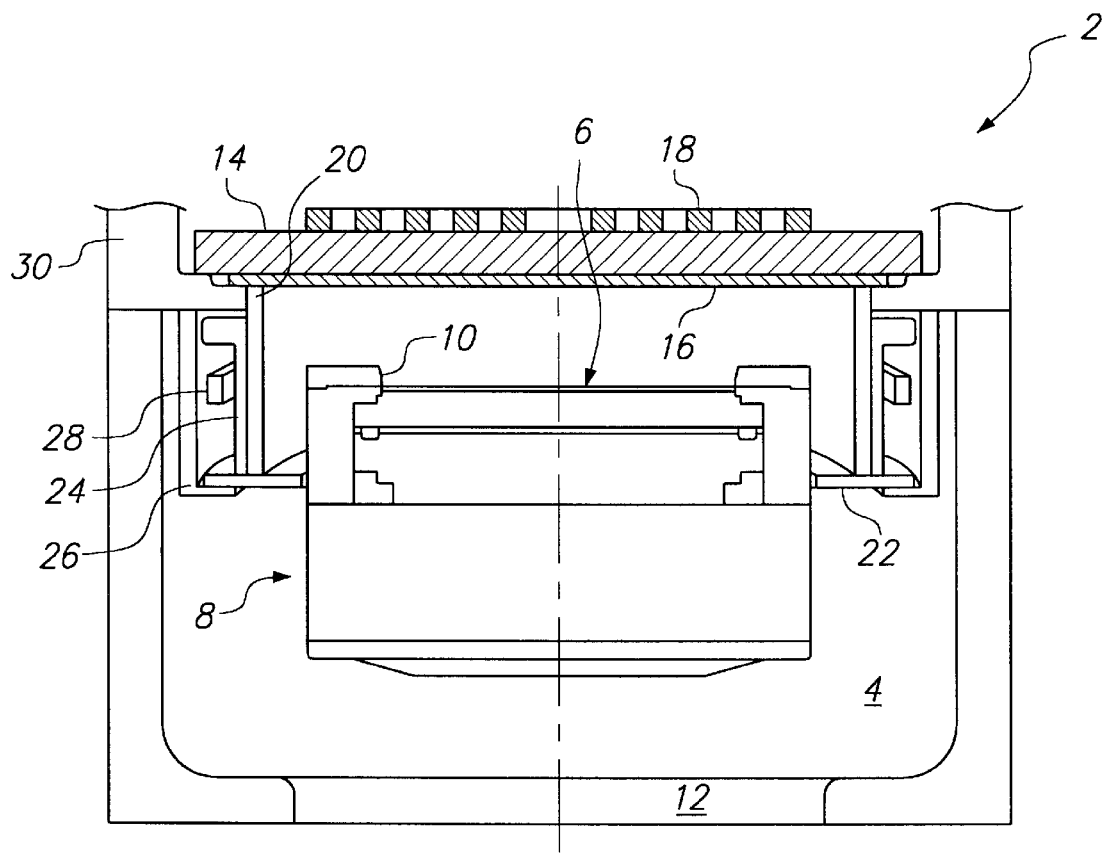
FIG. 1 shows a plasma reaction chamber in accordance with a first embodiment of the invention wherein a ceramic liner supported on a resilient frame surrounds a substrate support.

A vacuum processing chamber according to the present invention may be used for various semiconductor plasma processing steps such as etching, deposition, resist stripping, etc. An example of a vacuum processing chamber 2 having an inductively coupled plasma source is shown in FIG. 1 wherein processing gas is supplied to the processing chamber 2 by suitable apparatus such as gas distribution rings, gas distribution plate, injection nozzles, etc., and a vacuum is maintained in the interior 4 of the chamber by suitable vacuum pump apparatus. The substrate to be processed in the chamber can comprise a silicon semiconductor wafer 6 supported on a substrate support 8. The substrate support 8 can include an electrostatic chuck and a focus ring 10. The vacuum pump can be connected to a large outlet port 12 in an endwall such as the bottom of the chamber. The vacuum processing chamber can include a dielectric window 14, a gas distribution plate 16 and RF power can be supplied to the chamber through an external RF antenna such as a planar coil 18 outside the dielectric window 14 on an endwall such as the top of the chamber. However, the plasma generating source can be of any other type of plasma generating equipment such as that of an ECR reactor, parallel plate reactor, helicon reactor, helical resonator, etc. The plasma generating source can be attached to a modular mounting arrangement such as an annular mounting flange which is removably mounted on the endwall of the chamber.

In order to maintain a vacuum tight seal between the mounting flange and the chamber 2, suitable O-ring seals can be fitted within grooves in the endwall of the chamber 2 and RF shielding members can surround the vacuum seals. If a large vacuum force is provided by the vacuum pump, it is not necessary to utilize fasteners for attaching the mounting flange to the chamber 2. Instead, the mounting flange can simply rest on the endwall of the chamber 2. If desired, the mounting flange or another part of the plasma generating source assembly can be hinged to the chamber 2 such that the plasma generating source can be pivoted to an orientation such as a vertical orientation for servicing the interior 4 of the chamber 2.

The chamber includes a ceramic liner such as a silicon or silicon carbide liner 20. A plasma screen 22 for confining the plasma in the space surrounding the wafer extends inwardly from the lower end of the liner 20. The liner 20 can be supported by an elastically bendable frame which includes an inner support frame 24 and an outer support frame 26. Details of flexible liner supports are disclosed in commonly owned U.S. patent application Ser. No. 09/161,074 filed Sep. 25, 1998, the disclosure of which is hereby incorporated by reference. In order to maintain the liner at a desired temperature during processing of a substrate, a radiant heater 28 is provided between the inner frame support 24 and the outer support frame 26. In operation, the heater 28 is effective to heat the liner 20 and removal of heat from the liner 20 can be accomplished by a temperature controlled member 30 which withdraws heat from the liner via thermal conduction through the inner and outer frames.

Figure 2:
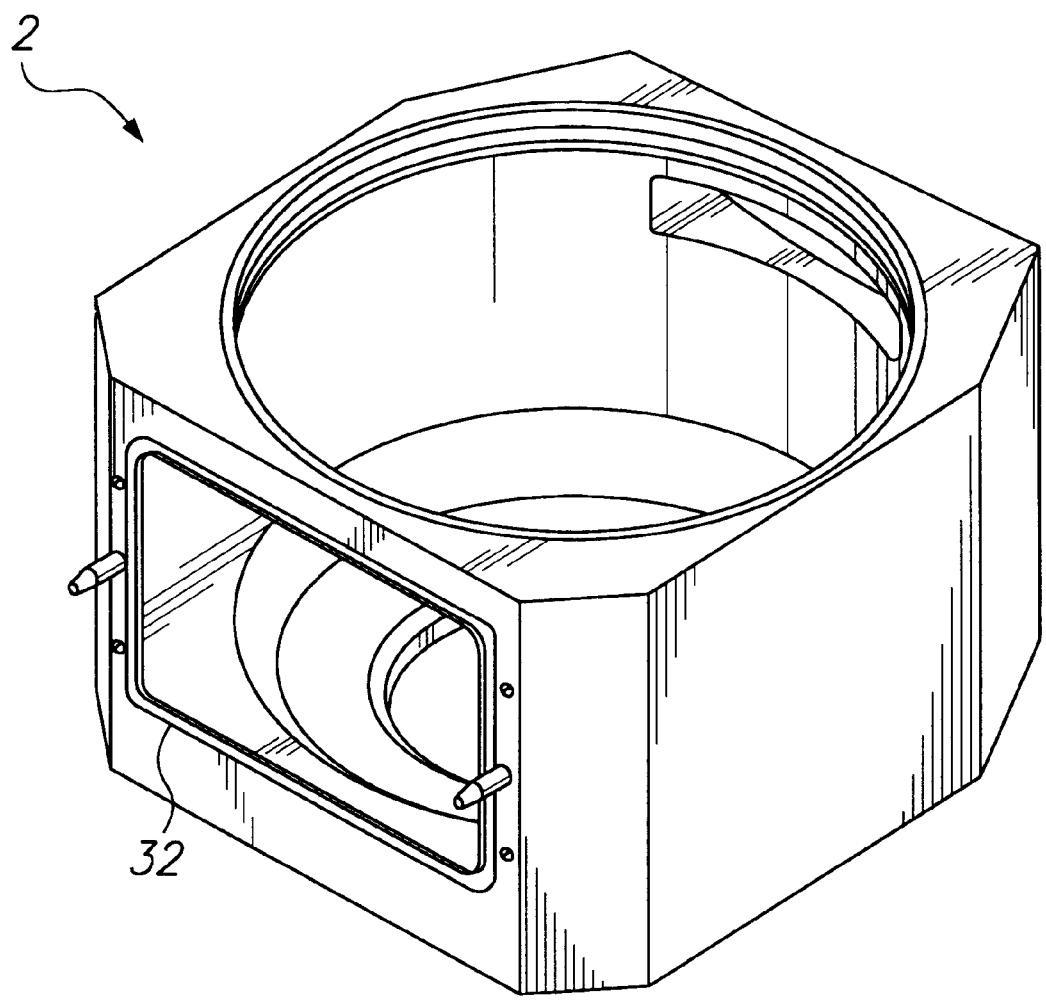
FIG. 2 shows the plasma reaction chamber of FIG. 1 without various components including the liner.

As shown in FIG. 2, the chamber can have a modular design which allows various plasma generating sources to be mounted thereon. Details of such systems are disclosed in commonly owned U.S. Pat. No. 5,820,723, the disclosure of which is hereby incorporated. Further, the substrate support 8 can be supported at one end of a support arm (not shown) mounted in a cantilever fashion such that the entire substrate support/support arm assembly can be removed from the chamber by passing the assembly through an opening 32 in the sidewall of the chamber.

The plasma chamber liner 20 can comprise a single or multicomponent liner, e.g., a cylindrical shell or interlocking ceramic liner element such as flat tiles. Details of such a tiled liner are set forth in commonly owned U.S. Ser. No. 09/401,193 filed on Sep. 23, 1999, the disclosure of which is hereby incorporated by reference. To provide an electrical ground path for the plasma, the liner or liner elements are preferably of an electrically conductive material such as silicon or silicon carbide. Such a material provides an added benefit in that it does not contain aluminum and thus reduces Al contamination of processed substrates. The liner and/or plasma screen and other ceramic parts in the reactor can be bonded to suitable support members which can be made of ceramic or metal such as aluminum. A preferred bonding material is an electrically conductive elastomer which can absorb lateral stresses caused by different thermal expansion coefficients of the SiC and Al. Temperature control of the liner is achieved by a radiant heater supplied power by suitable electrical leads and a temperature controlled member can be used to withdraw heat from the liner.

The elastomeric joint can comprise any suitable elastomeric material such as a polymer material compatible with a vacuum environment and resistant to thermal degradation at high temperatures such as above 200° C. The elastomer material can optionally include a filler of electrically and/or thermally conductive particles or other shaped filler such as wire mesh, woven or non-woven conductive fabric, etc. Polymeric materials which can be used in plasma environments above 160° C. include polyimide, polyketone, polyetherketone, polyether sulfone, polyethylene terephthalate, fluoroethylene propylene copolymers, cellulose, triacetates, silicone, and rubber. Examples of high purity elastomeric materials include one-component room temperature curing adhesives available from General Electric as RTV 133 and RTV 167, a one-component flowable heat-curable (e.g. over 100° C.) adhesive available from General Electric as TSE 3221, and a two-part addition cure elastomer available from Dow Corning as "SILASTIC." An especially preferred elastomer is a polydimethylsiloxane containing elastomer such as a catalyst cured, e.g. Pt-cured, elastomer available from Rhodia as V217, an elastomer stable at temperatures of 250° C. and higher.

In the case where the elastomer is an electrically conductive elastomer, the electrically conductive filler material can comprise particles of a an electrically conductive metal or metal alloy. A preferred metal for use in the impurity sensitive environment of a plasma reaction chamber is an aluminum alloy such as a 5–20 weight % silicon containing aluminum base alloy. For example, the aluminum alloy can include about 15 wt % silicon. However, filler particles of other conductive materials such as silicon or silicon carbide can also be used.

The plasma screen 22 extends inwardly from a lower edge of the liner 20. The plasma screen 22 is preferably of an electrically conductive ceramic material such as silicon or silicon carbide and includes openings (not shown) which are small enough to confine the plasma but allow process gas and processing byproducts to be removed by the vacuum pump.

The heater 28 can comprise an electrical resistance heating element embedded in an aluminum casting. Thus, by passing electrical current through the heating element, heat will be supplied to the aluminum casting which in turn radiates heat towards the liner 20. The heater 28 can be mounted in an open area between the inner and outer frame members 24, 26, whereby during heating and cooling of the aluminum body of the heater, the heater can freely expand and contract. In order to accommodate expansion and contraction of the liner 20, the inner and outer support frames can be configured to be elastically bendable. For example, the frames can be segmented such that a series of axially extending lower portions thereof are separated by axially extending slits. In addition, the inner and outer frames can be configured to provide a desired amount of thermal conductance. For instance, the outer frame 26 can be of a metal such as aluminum or an aluminum alloy and a lower portion thereof can have a thickness sufficient to withdraw heat from the liner and a thin upper portion to allow adequate bending of the outer frame due to thermal stresses during processing of a semiconductor substrate.

The ceramic liner 20 can also comprise a continuous free standing cylindrical liner which is bonded to backing plates by the electrically and thermally conductive elastomer. The outer frame 26 can include segments separated by a series of axially extending slots and the inner frame 24 can include segments separated by a series of axially extending slots. The segments can have the same width in the circumferential direction as the individual backing plates.

Figure 3:
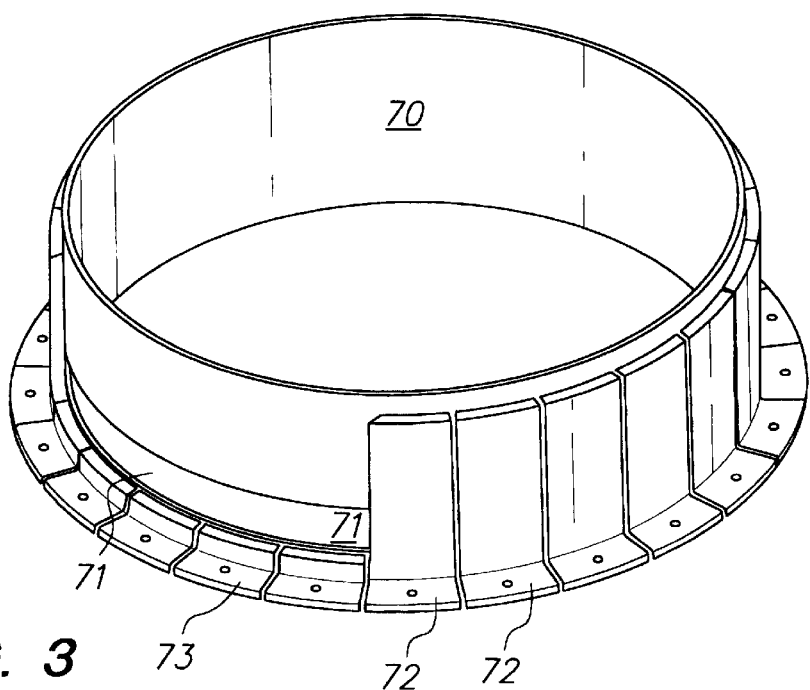
FIG. 3 shows details of a segmented metal frame attached to a lower edge of the cylindrical liner of FIG. 1.

According to another embodiment of the invention, flanges 72 are bonded with the thermally and electrically conductive elastomer to the exterior of a continuous cylindrical ceramic liner 70, as shown in FIG. 3. In the case of a thin liner, the flanges are preferably of a length which substantially covers the outside of the liner. However, in the case of a thick liner, the flanges can be shorter, e.g., the flanges for thick liners can be relatively short in length like the flanges 73 located beneath the wafer transport slot 71 in FIG. 3. The flanges are preferably of a metal such as aluminum and are bent outwardly at the bottom thereof for attachment to a support arrangement such as an elastically bendable support frame.

To remove heat from the liner, a temperature controlled member in thermal contact with the support frame can be used as a heat sink to draw heat from the liner through a heat flow path passing through the flanges, the support frame and into the temperature controlled member. The flanges can be discrete pieces which are not connected together or they can be portions of a segmented ring. Accordingly, the flanges can be designed to accommodate differential thermal expansion between the resilient support and the liner. The heat generated by absorbed ion energy built up on the liner can flow to the chamber through the flanges and the support connecting the flange to the liner. In the case where the support includes the segmented inner and outer metal frames, the segmented outer support can move radially with respect to a portion thereof attached to the chamber. With the resilient support arrangement, such radial movement, however, produces a low enough radial force which does not overstress the elastomer bond between the flanges and the ceramic liner.

Figure 4:
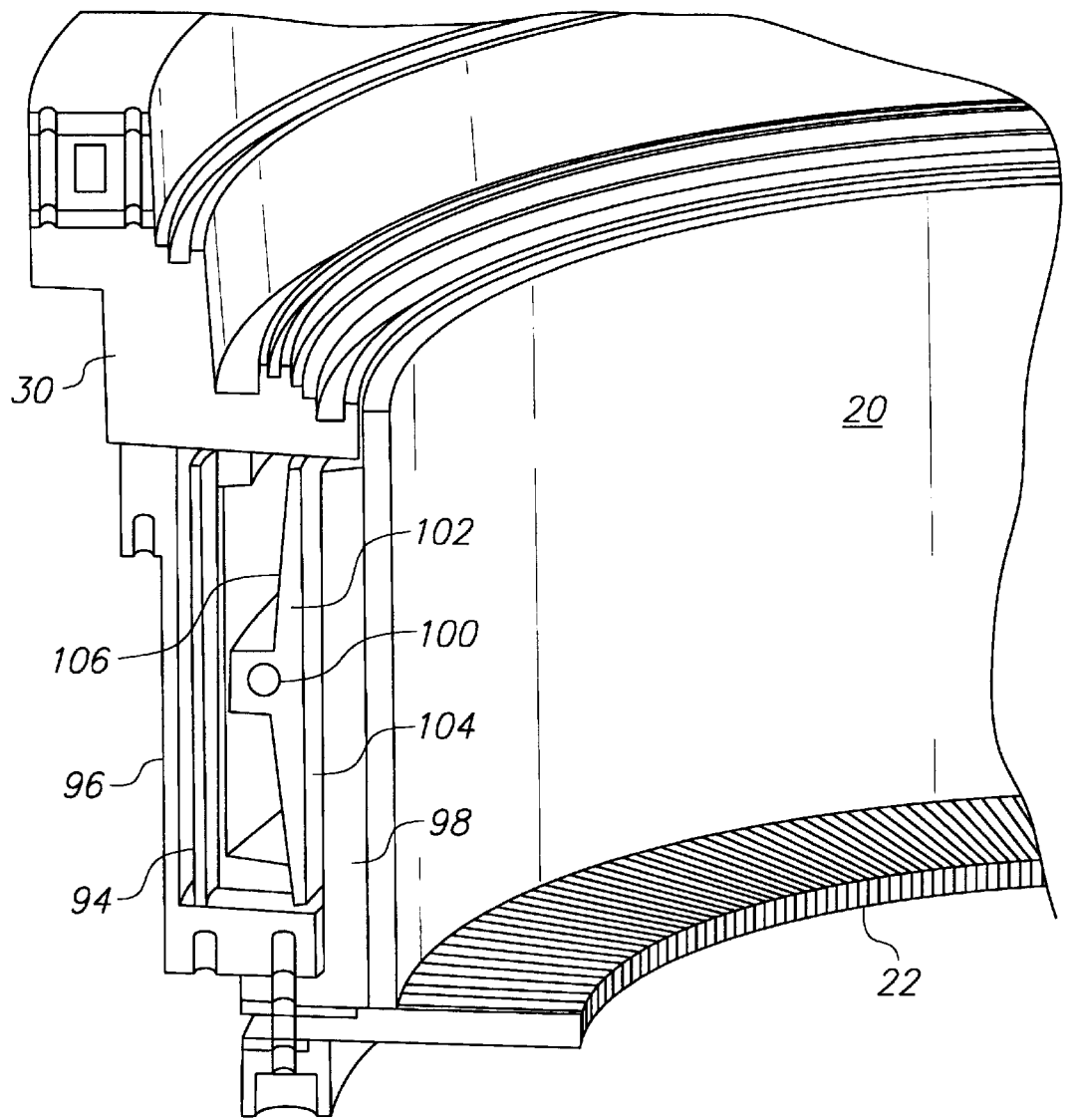
FIG. 4 shows a heater arrangement in accordance with one embodiment of the invention.
Figure 5:
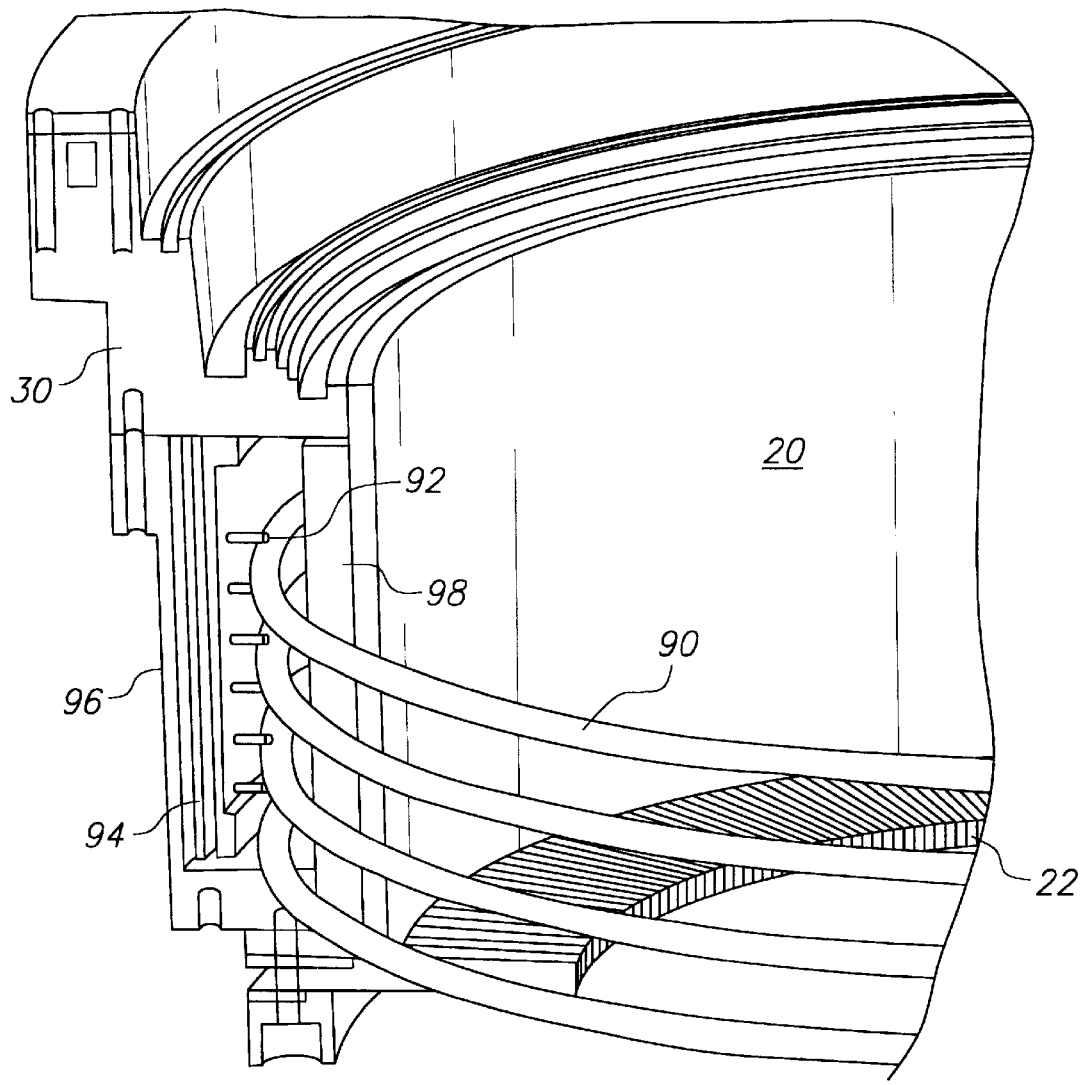
FIG. 5 shows a heater arrangement in accordance with another embodiment of the invention.

FIGS. 4 and 5 illustrate heater designs wherein a chamber liner is heated by thermal radiation. The chamber liner is preferably a ceramic liner such as a cylindrical one-piece Si or SiC liner. In addition, the plasma screen and/or the gas distribution plate can also be of Si or SiC. SiC is a preferred material for the liner, plasma screen and the gas distribution plate since it does not release contaminating species when sputtered by the plasma. Further, the SiC of the liner and plasma screen can be provided with high electrical conductivity which aids in confining the plasma. In the case where the plasma generating source is an inductive coupling source such as an antenna, the gas distribution plate can be made of a SiC which is not electrically conductive. Such conductive and non-conductive SiC materials can be provided as a free standing shaped part by depositing the SiC to a desired thickness on a carbon substrate having the shape of the liner, plasma screen or gas distribution plate. In order to provide a totally SiC shaped part, the carbon can be machined away to provide a shaped part made entirely of the CVD SiC.

In order to heat the ceramic liner without placing damaging mechanical stresses on the liner as it is heated or cooled, the heater is supported independently from the liner by a resilient heater support. For instance, as shown in FIG. 4, the heater can comprise an annular metal member as a heat radiating body 102 having a resistance heating element 100 embedded therein and the annular metal member can be supported by a plurality of resilient hangers such as metal straps. In another arrangement, as shown in FIG. 5, the heater can comprise a plurality of turns of a heater coil 90 surrounding the outer periphery of the liner and the coil can be supported by any suitable arrangement such as its electrical leads, support pins 92 extending from a chamber wall such that one or more turns of the coil are supported or brackets having spaced apart coil engaging portions which maintain the turns of the coil in a desired configuration during heating and temperature cycling of the heating coil. In the arrangements shown in FIGS. 4 and 5, a radiation shield 94 such as a thin anodized sheet of aluminum reflects heat inwardly towards the liner. A resilient support 96 is attached at its upper end to the temperature controlled member 30 and at its lower end to a plurality of circumferentially spaced apart backing plates 98.

During processing of semiconductor substrates such as plasma etching of silicon wafers, in order to minimize deposition of polymer from gaseous byproducts produced during the etching process, it is desirable to maintain chamber surfaces exposed to the plasma at temperatures of about 80° C. to about 160° C., preferably 110 to 150° C. In addition, such temperature control of these surfaces provides reduction in processing drift during sequential processing of individual wafers.

In the arrangement shown in FIG. 4, the heater comprises a resistance heating element 100 such as nichrome wire embedded in a heat radiating body 102. The heat radiating body 102 includes a heat radiating surface 104 facing the ceramic liner 20. According to a preferred embodiment, the heating element is located in a cast aluminum body. For example, the heater can be made by placing the heating element in a mold cavity having the shape of the heat radiating body and filling the mold cavity with molten aluminum. The heat radiating surface 104 can be surface treated such as by anodization to increase thermal emissivity of the aluminum casting. Other surfaces of the aluminum casting, such as the outer surface 106, are preferably not anodized so that they will have lower emissivity and thus minimize heat radiation in directions not facing the ceramic liner. The heating coil 90 shown in FIG. 5 comprises a resistance heating element such as nichrome wire and an outer coating of electrically insulating and heat radiating material such as a ceramic coating. The heaters shown in FIGS. 4 and 5 can be controlled to achieve a desired temperature of the ceramic liner by a controller which adjusts power to the heaters as a function of monitored temperature of the liner or the liner support.

While the invention has been described in detail with reference to specific embodiments thereof, it will be apparent to those skilled in the art that various changes and modifications can be made, and equivalents employed, without departing from the scope of the appended claims.

What is claimed is:

1. A plasma processing system useful for processing semiconductor substrates comprising:

a plasma processing chamber having an interior space bounded by a chamber sidewall;

a substrate support on which a substrate is processed within the interior space, the chamber sidewall being spaced outwardly of a periphery of the substrate support;

a gas supply through which process gas can be supplied to the interior space during processing of the substrate;

an energy source which can energize the process gas in the interior space into a plasma state during processing of the substrate;

a ceramic liner supported between the chamber sidewall and the periphery of the substrate support; and a heater which heats the liner by radiant heating, wherein the heater is located in a gap between the ceramic liner and the chamber sidewall and wherein the heater is separated from an outer periphery of the liner by an open space.

2. The plasma processing system of claim 1, wherein the heater comprises a resistance heating element embedded in a heat radiating body having a heat radiating surface separated from an outer periphery of the liner by an open space.

3. The plasma processing system of claim 1, wherein the heater comprises a resistance heating coil separated from an outer periphery of the liner by an open space.

4. The plasma processing system of claim 1, further comprising a heat radiating shield between the heater and the chamber sidewall.

5. The plasma processing system of claim 1, wherein the ceramic liner comprises a one-piece ceramic liner or an assembly of ceramic tiles.

6. The plasma processing system of claim 1, wherein the ceramic liner is bonded to a metal support by an elastomeric joint.

7. The plasma processing system of claim 6, wherein the metal support is attached to a thermally controlled member such that heat can be withdrawn from the ceramic liner via a thermal path which extends through the elastomeric joint and the metal support to the thermally controlled member.

8. The plasma processing system of claim 1, wherein the ceramic liner comprises an assembly of ceramic tiles bonded to the chamber sidewall by an elastomer.

9. The plasma processing system of claim 1, wherein the ceramic liner is supported by a bendable metal frame, the bendable metal frame being supported by a thermally controlled member such that heat can be removed from the ceramic liner through a thermal path extending through the bendable metal frame to the thermally controlled member.

10. The plasma processing system of claim 1, further comprising at least one resilient heater support supporting the heater.

11. The plasma processing system of claim 1, wherein the ceramic liner comprises a plurality of interlocking SiC tiles or a one-piece SiC liner.

12. The plasma processing system of claim 1, wherein the ceramic liner further includes a ceramic plasma screen extending inwardly toward the substrate support from a lower portion of the ceramic liner, the ceramic plasma screen including passages through which process gas and reaction byproducts are removed from the interior of the chamber during processing of a substrate.

13. A method of processing a substrate with the apparatus of claim 1, wherein an individual substrate supported on the substrate support is etched with plasma produced in the chamber.

14. A plasma processing system useful for processing semiconductor substrates comprising:

a plasma processing chamber having an interior space bounded by a chamber sidewall;

a substrate support on which a substrate is processed within the interior space, the chamber sidewall being spaced outwardly of a periphery of the substrate support;

a gas supply through which process gas can be supplied to the interior space during processing of the substrate;

an energy source which can energize the process gas in the interior space into a plasma state during processing of the substrate;

a ceramic liner supported between the chamber sidewall and the periphery of the substrate support;

a heater which heats the liner by radiant heating;

at least one resilient heater support supporting the heater; and wherein the ceramic liner is supported by a resilient support member comprising a bendable metal frame which includes an inner frame member and an outer frame member, an elastomeric joint joins the ceramic liner to the inner frame member, the inner frame member is supported by the outer frame member, and the outer frame member is supported by the chamber.

15. A plasma processing system useful for processing semiconductor substrates comprising:

a plasma processing chamber having an interior space bounded by a chamber sidewall;

a substrate support on which a substrate is processed within the interior space, the chamber sidewall being spaced outwardly of a periphery of the substrate support;

a gas supply through which process gas can be supplied to the interior space during processing of the substrate;

an energy source which can energize the process gas in the interior space into a plasma state during processing of the substrate;

a ceramic liner supported between the chamber sidewall and the periphery of the substrate support;

a heater which heats the liner by radiant heating; and wherein the ceramic liner is supported by a resilient support member comprising inner and outer metal frame members configured to allow differential thermal stresses on the ceramic liner and the frame members to be accommodated during operation of the plasma processing system.

16. The plasma processing system of claim 15, wherein the inner and outer frame members are aluminum frame members.

17. The plasma processing system of claim 16, wherein an upper portion of the outer frame member is supported by a thermally controlled part of the chamber, a lower portion of the outer frame member is attached to a lower portion of the inner frame member, and the ceramic liner is supported by the inner frame member.

18. The plasma processing system of claim 15, wherein the inner and outer metal frame members are cylindrical and include continuous upper portions and segmented lower portions, the segmented lower portions comprising axially extending segments separated from each other by axially extending slots.

19. A plasma processing system useful for processing semiconductor substrates comprising:

a plasma processing chamber having an interior space bounded by a chamber sidewall;

a substrate support on which a substrate is processed within the interior space, the chamber sidewall being spaced outwardly of a periphery of the substrate support;

a gas supply through which process gas can be supplied to the interior space during processing of the substrate;

an energy source which can energize the process gas in the interior space into a plasma state during processing of the substrate;

a ceramic liner supported between the chamber sidewall and the periphery of the substrate support;

a heater which heats the liner by radiant heating; and wherein the ceramic liner is supported by a bendable metal frame, the bendable metal frame including a continuous upper portion and a segmented lower portion.

20. The plasma processing system of claim 19, wherein the bendable metal frame is cylindrical and the segmented lower portion comprises axially extending segments separated from each other by axially extending slots.

* * * * *